(12) United States Patent
Tseng et al.

(10) Patent No.: US 8,093,118 B2
(45) Date of Patent: Jan. 10, 2012

(54) SEMICONDUCTOR STRUCTURE AND METHOD OF FORMING THE SAME

(75) Inventors: Kun-Szu Tseng, Pingtung County (TW);
Che-Hua Hsu, Hsinchu County (TW);
Cheng-Wen Fan, Tainan County (TW);
Chih-Yu Tseng, Hsinchu (TW); Victor Chiang Liang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/493,074

(22) Filed: Jun. 26, 2009

(65) Prior Publication Data
US 2010/0327378 A1   Dec. 30, 2010

(51) Int. Cl.
*H01L 21/337* (2006.01)
*H01L 21/8234* (2006.01)
*H01L 21/20* (2006.01)

(52) U.S. Cl. ........ 438/190; 438/238; 438/240; 438/381; 257/379; 257/E21.004; 257/E21.637; 257/E27.016

(58) Field of Classification Search .................. 438/176, 438/190, 238, 240, 381; 257/379, 380, E21.004, 257/E21.637, E27.016
See application file for complete search history.

(56) References Cited

U.S. PATENT DOCUMENTS

| | | | |
|---|---|---|---|
| 5,126,279 | A | 6/1992 | Roberts |
| 6,864,135 | B2 * | 3/2005 | Grudowski et al. ........... 438/230 |
| 7,488,637 | B2 * | 2/2009 | Kim .............................. 438/201 |
| 7,622,345 | B2 * | 11/2009 | Ting et al. ..................... 438/238 |
| 2007/0111425 | A1 * | 5/2007 | Wu et al. ....................... 438/216 |
| 2010/0019344 | A1 * | 1/2010 | Chuang et al. ................ 257/516 |
| 2010/0052072 | A1 * | 3/2010 | Li et al. ......................... 257/380 |
| 2010/0148262 | A1 * | 6/2010 | Stahrenberg et al. ......... 257/350 |
| 2010/0308330 | A1 * | 12/2010 | Stahrenberg et al. ........... 257/49 |

OTHER PUBLICATIONS

Dao et al., "Metal Gate Effects on a 32nm Metal Gate Resistor", IEEE 2008.

* cited by examiner

*Primary Examiner* — Hsien Ming Lee
(74) *Attorney, Agent, or Firm* — J.C. Patents

(57) ABSTRACT

A semiconductor structure and a method of forming the same are provided. The semiconductor structure includes a substrate, a resistor and a metal gate structure. The substrate has a first area and a second area. The resistor is disposed in the first area, wherein the resistor does not include any metal layer. The metal gate structure is disposed in the second area.

12 Claims, 6 Drawing Sheets

SEMICONDUCTOR STRUCTURE AND METHOD OF FORMING THE SAME

BACKGROUND OF THE INVENTION

1. Field of Invention

The present invention relates to a semiconductor structure and a method of forming the same, and more generally to a semiconductor structure including a resistor and a metal gate structure and a method of forming the same.

2. Description of Related Art

As the dimension of a semiconductor device is getting smaller, the dimension of the gate structure and the thickness of the gate insulation layer are reduced accordingly. However, a leakage current occurs when the gate insulation layer of silicon oxide becomes thinner. To reduce the leakage current, a high dielectric constant (high-k) material is used to replace silicon oxide for forming the gate insulation layer. The gate of polysilicon may react with the high-k material to generate a Fermi-level pinning, so that the threshold voltage is increased and the performance of the device is affected. Therefore, a metal layer (i.e. so-called work function metal layer) is used as a gate, so as to avoid an increase in the threshold voltage and reduce the resistance of the device.

The metal gate process is usually integrated with the process of forming a voltage divider such as a resistor. As the design rule of the semiconductor device is scaled down, the standard for the resistor in the metal gate process is accordingly increased. Therefore, how to fabricate a resistor with good performance in the metal gate process has been one of the main topics in the industry.

SUMMARY OF THE INVENTION

The present invention provides a semiconductor structure and a method of forming the same. The formed resistor does not include any metal layer to deviate the performance thereof, and the forming method is simple without adding any extra mask.

The present invention provides a method of forming a semiconductor structure. First, a substrate having a first area and a second area is provided. Thereafter, a dielectric layer and a metal layer are sequentially formed over the substrate in the first area and the second area. Afterwards, the metal layer in the first area is removed by using a salicide block mask. The polysilicon layer is then formed over the substrate in the first area and the second area. Thereafter, the polysilicon layer, the metal layer and the dielectric layer are patterned, so as to form a resistor in the first area and a metal gate structure in the second area.

According to an embodiment of the present invention, the method of forming the semiconductor structure further includes forming a shallow trench isolation (STI) structure in the substrate in the first area.

According to an embodiment of the present invention, the method of forming the semiconductor structure further includes forming a salicide block layer over the substrate to expose the polysilicon layer and the substrate in the second area after the step of forming the resistor in the first area and the metal gate structure in the second area.

According to an embodiment of the present invention, during the step of removing the metal layer in the first area includes the following steps. First, a patterned photoresist layer is formed over the substrate to expose the metal layer in the first area, wherein a mask used for forming the patterned photoresist layer is the salicide block mask used for forming the salicide block layer. Thereafter, the metal layer in the first area is removed by using the patterned photoresist layer as a mask.

According to an embodiment of the present invention, the patterned photoresist layer includes a negative photoresist material, for example.

According to an embodiment of the present invention, the dielectric layer is a stacked structure including a high-k layer and a cap layer sequentially formed on the substrate.

According to an embodiment of the present invention, the high-k layer includes $HfO_2$, $ZrO_2$, $Al_2O_3$, AlN, TiO2, $La_2O_3$, $Y_2O_3$, $Gd_2O_3$, $Ta_2O_5$ or a combination thereof, for example.

According to an embodiment of the present invention, the cap layer includes $Al_2O_3$, $Ga_2O_3$, $In_2O_3$ or $Ti_2O_3$ when the second area is for forming a PMOS transistor, or includes $La_2O_3$, $Dy_2O_3$, $Y_2O_3$, $MgO_2$ or an oxide of a lanthanide series element when the second area is for forming a NMOS transistor, for example.

According to an embodiment of the present invention, the metal layer includes TiN, TaC, TaCNO, TaCN or TaN, for example.

The present invention further includes a semiconductor structure including a substrate, a resistor and a metal gate structure. The substrate has a first area and a second area. The resistor is disposed in the first area, wherein the resistor does not include any metal layer. The metal gate structure is disposed in the second area.

According to an embodiment of the present invention, the semiconductor structure further includes a shallow trench isolation structure disposed in the substrate in the first area.

According to an embodiment of the present invention, the resistor includes a dielectric layer and a polysilicon layer sequentially disposed on the substrate.

According to an embodiment of the present invention, the metal gate structure includes a dielectric layer, a metal layer and a polysilicon layer sequentially disposed on the substrate.

According to an embodiment of the present invention, the dielectric layer is a stacked structure including a high-k layer and a cap layer sequentially disposed on the substrate.

According to an embodiment of the present invention, the high-k layer includes $HfO_2$, $ZrO_2$, $Al_2O_3$, AlN, TiO2, $La_2O_3$, $Y_2O_3$, $Gd_2O_3$, $Ta_2O_5$ or a combination thereof, for example. The cap layer includes $Al_2O_3$, $Ga_2O_3$, $In_2O_3$ or $Ti_2O_3$ when the second area is for forming a PMOS transistor, or includes $La_2O_3$, $Dy_2O_3$, $Y_2O_3$, $MgO_2$ or an oxide of a lanthanide series element when the second area is for forming a NMOS transistor, for example.

According to an embodiment of the present invention, the metal layer comprises TiN, TaC, TaCNO, TaCN or TaN, for example.

In view of above, the resistor of the present invention does not include any metal layer, and the current flows through the polysilicon layer instead of the metal layer, so that the resistance thereof is not degraded. Further, the method of removing the metal layer in the resistor area can be completed with the existing mask and no extra mask is needed. Therefore, the fabrication cost is saved and the competitive advantage is achieved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A to 1F schematically illustrate, in a cross-sectional view, a method of forming a semiconductor structure according to an embodiment of the present invention.

Figure 1A:
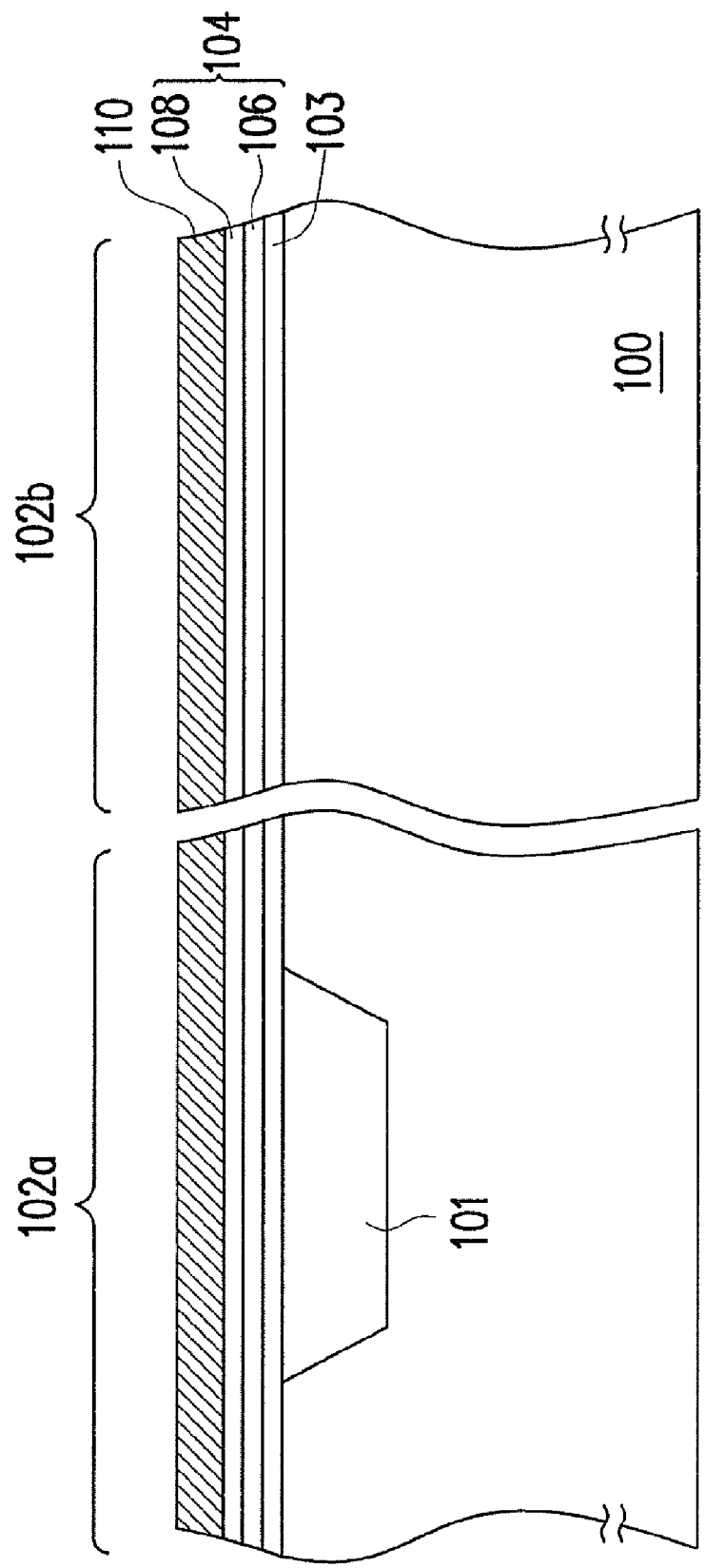
FIGS. 1A to 1F schematically illustrate, in a cross-sectional view, a method of forming a semiconductor structure according to an embodiment of the present invention.

Referring to FIG. 1A, a substrate 100 is provided. The substrate is a semiconductor substrate such as a silicon substrate, for example. The substrate 100 has a first area 102a for forming a resistor and a second area 102b for forming a MOS transistor. Further, a shallow trench isolation (STI) structure 101 is formed in the substrate 100 in the first area 102a. Thereafter, a dielectric layer 104 and a metal layer 110 are sequentially formed over the substrate 100 in the first area 102a and the second area 102b. The dielectric layer 104 is a stacked structure including a high-k layer 106 and a cap layer 108 sequentially formed on the substrate 100. The high-k layer 106 includes a dielectric material with a dielectric constant greater than 4, for example. The high-k layer 106 includes $HfO_2$, $ZrO_2$, $Al_2O_3$, AlN, TiO2, $La_2O_3$, $Y_2O_3$, $Gd_2O_3$, $Ta_2O_5$ or a combination thereof, for example. The cap layer 108 is a metal oxide layer and the material thereof includes $Al_2O_3$, $Ga_2O_3$, $In_2O_3$ or $Ti_2O_3$ when the second area 102b is for forming a PMOS transistor, or includes $La_2O_3$, $Dy_2O_3$, $Y_2O_3$, $MgO_2$ or an oxide of a lanthanide series element when the second area 102b is for forming a NMOS transistor, for example. The metal layer 110 includes TiN, TaC, TaCNO, TaCN or TaN, for example. The method of forming the high-k layer 106, the cap layer 108 and the metal layer 110 includes performing a chemical vapor deposition (CVD) process, for example.

In an embodiment, an insulation layer 103 is optionally formed on the substrate 100 before the step of forming the high-k layer 106, so as to increase the adhesion between the high-k layer 106 and the substrate 100. The insulation layer 103 includes silicon oxide, and the forming method thereof includes performing a thermal oxide process, for example.

Figure 1B:
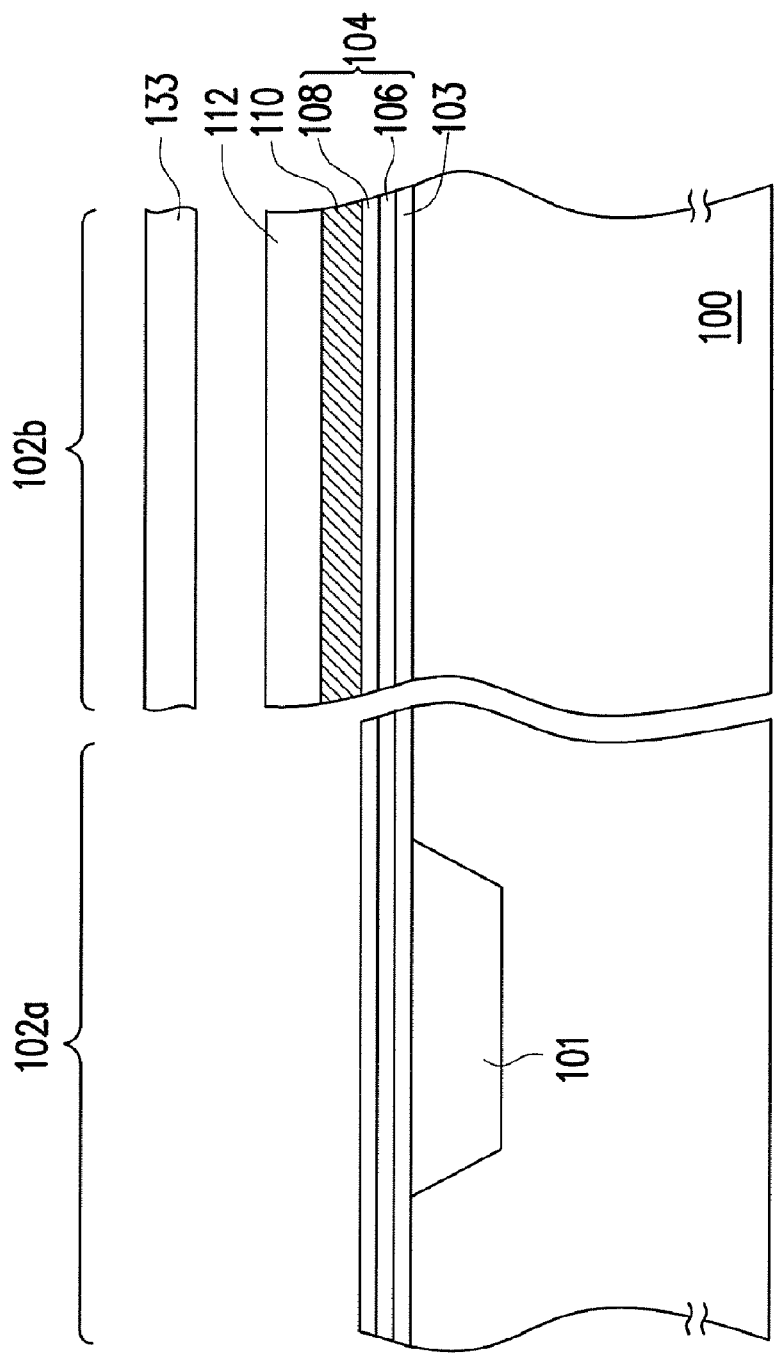

Referring to FIG. 1B, a patterned photoresist layer 112 is formed over the substrate 100 to expose the metal layer 110 in the first area 102a. Thereafter, the metal layer 110 in the first area 102a is removed by using the patterned photoresist layer 112 as a mask. A mask 133 for forming a salicide block (SAB) layer 132a (will be described in FIG. 1E) and a negative photoresist material can be used for defining the patterned photoresist layer 112 and then patterning the metal layer 110. That is, the metal layer 110 in the first area 102a is removed by using the SAB mask 133. As a result, the method in accordance with the present invention does not need an extra mask to remove the metal layer 110 in the first area 102a, so that the fabrication cost is reduced. Afterwards, the patterned photoresist layer 112 is removed.

Figure 1C:
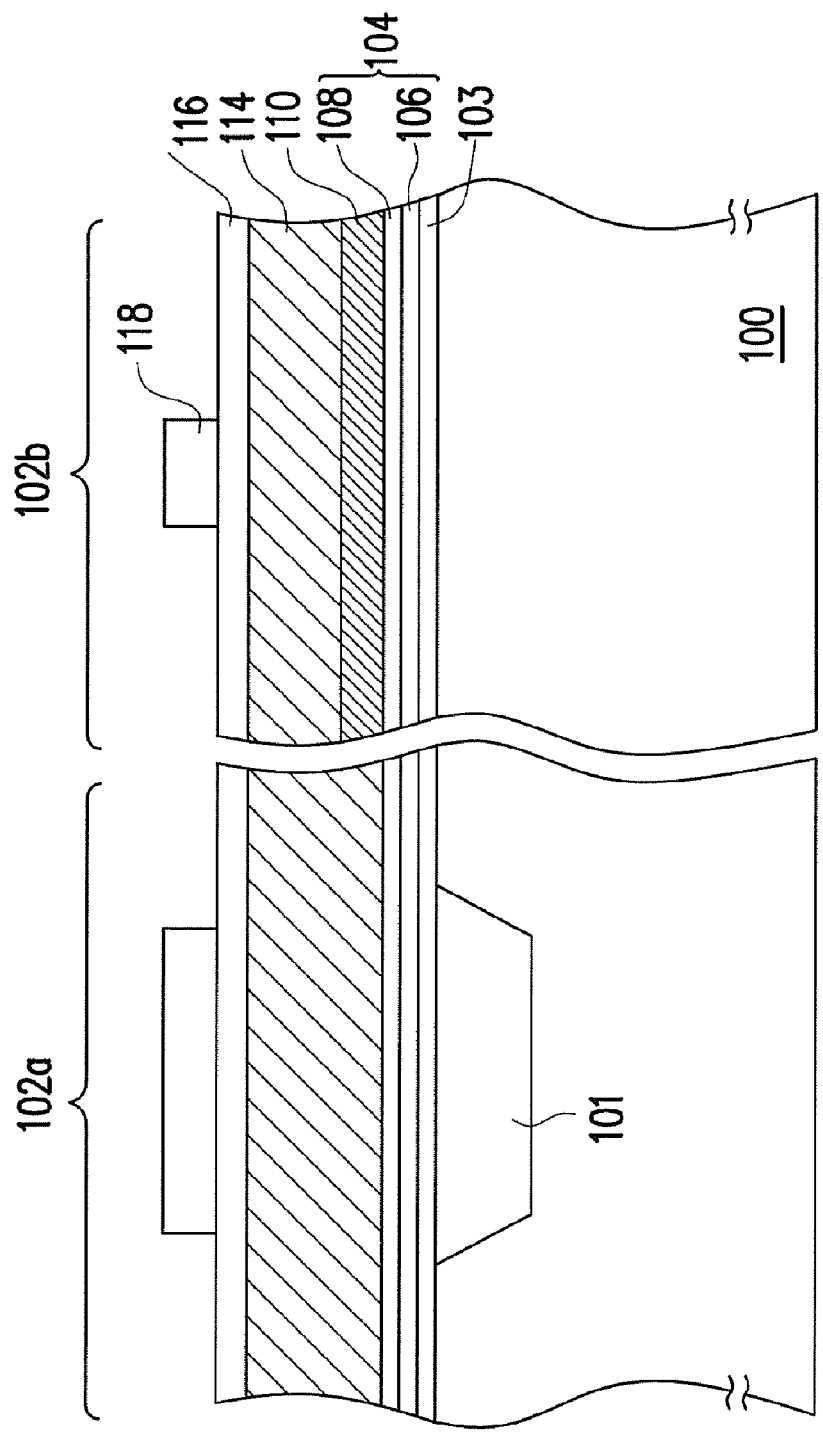

Referring to FIG. 1C, a polysilicon layer 114 and an optional hard mask layer 116 are sequentially formed over the substrate 100 in the first area 102a and the second area 102b. The hard mask layer 116 includes silicon oxide, silicon nitride or silicon oxynitride, for example. The method of forming the polysilicon layer 114 and the hard mask layer 116 includes performing a CVD process, for example. Thereafter, a patterned photoresist layer 118 is formed on the hard mask layer 116.

Figure 1D:
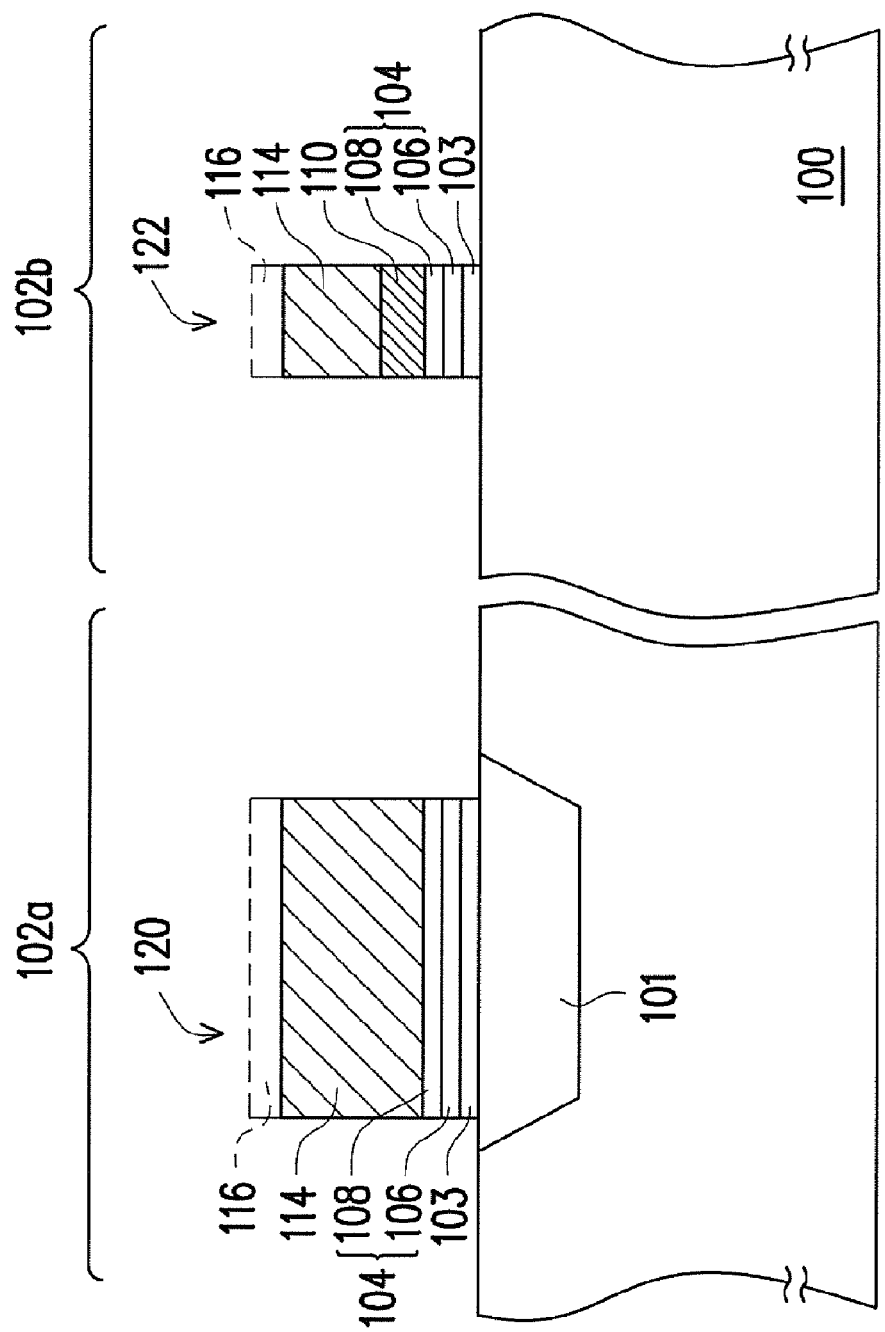

Referring to FIG. 1D, the hard mask layer 116, the polysilicon layer 114, the metal layer 110, the dielectric layer 104 and the insulation layer 103 are patterned, using the patterned photoresist layer 118 as a mask, so as to form a resistor 120 in the first area 102a and a metal gate structure 122 in the second area 102b. Thereafter, the hard mask layer 116 is removed.

As shown in FIG. 1D, the resistor 120 in the first area 102a includes an insulation layer 103, a dielectric layer 104 and a polysilicon layer 114 sequentially disposed on the substrate 100, wherein the dielectric layer 104 is a stacked structure including, from bottom to top, a high-k layer 106 and a cap layer 108. Further, a STI structure 101 is disposed in the substrate 100 in the first area 102a, and the resistor 120 is formed on the STI structure 101.

Compared to the conventional resistor structure, the resistor 120 of the present invention does not include any metal layer, so that the current flows through the polysilicon layer 114 instead of the metal layer and thus the performance of the resistor 120 is not degraded.

On the other hand, the metal gate structure 122 in the second area 102b includes an insulation layer 103, a dielectric layer 104, a metal layer 110 and a polysilicon layer 114 sequentially formed on the substrate 100, wherein the dielectric layer 104 is a stacked structure including, from bottom to top, a high-k layer 106 and a cap layer 108. The metal gate structure 122 has the metal layer 110 and further a metal salicide layer 136 (will be described in FIG. 1F), so as to reduce the resistance thereof.

Figure 1E:
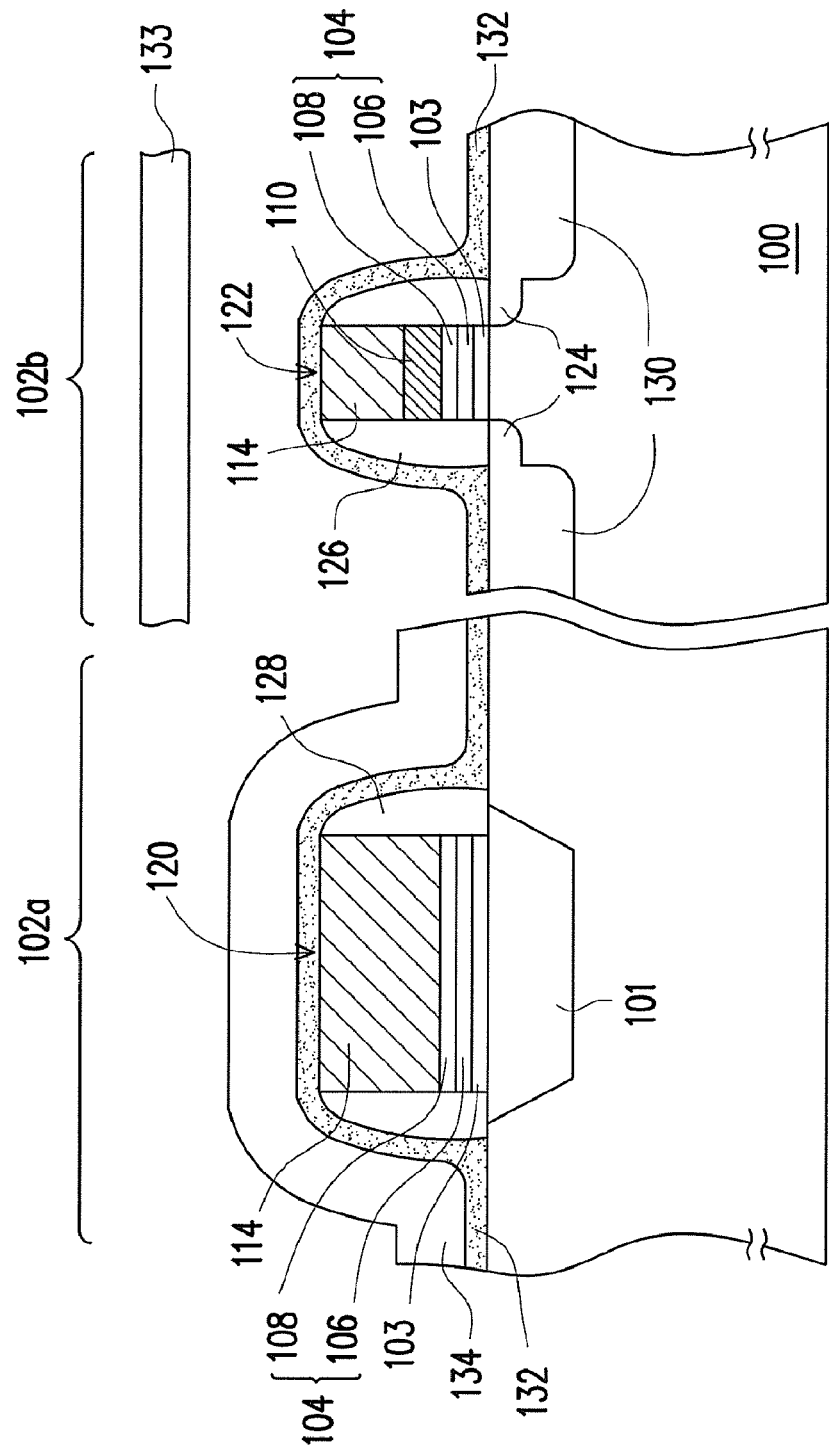

Referring to FIG. 1E, lightly-doped regions 124 are formed in the substrate 100 beside the metal gate structure 122 in the second area 102b. Thereafter, spacers 126 and spacers 128 are respectively formed on the sidewalls of the metal gate structure 122 and the resistor 120. Afterwards, heavily-doped regions 130 are formed in the substrate 100 beside the spacers 126 in the second area 102b, and an annealing process is performed thereto. The lightly-doped regions 124, the spacers 126 and 128 and the heavily-doped regions 130 are formed by known methods, and thus the details are not iterated herein.

Further, a salicide block (SAB) material layer 132 and a patterned photoresist layer 134 are sequentially formed over the substrate 100. A positive photoresist material and a mask 133 are used for defining the patterned photoresist layer 134. The patterned photoresist layer 134 exposes the second area 102b but covers the first area 102a where the metal salicide is not intended to form.

Figure 1F:
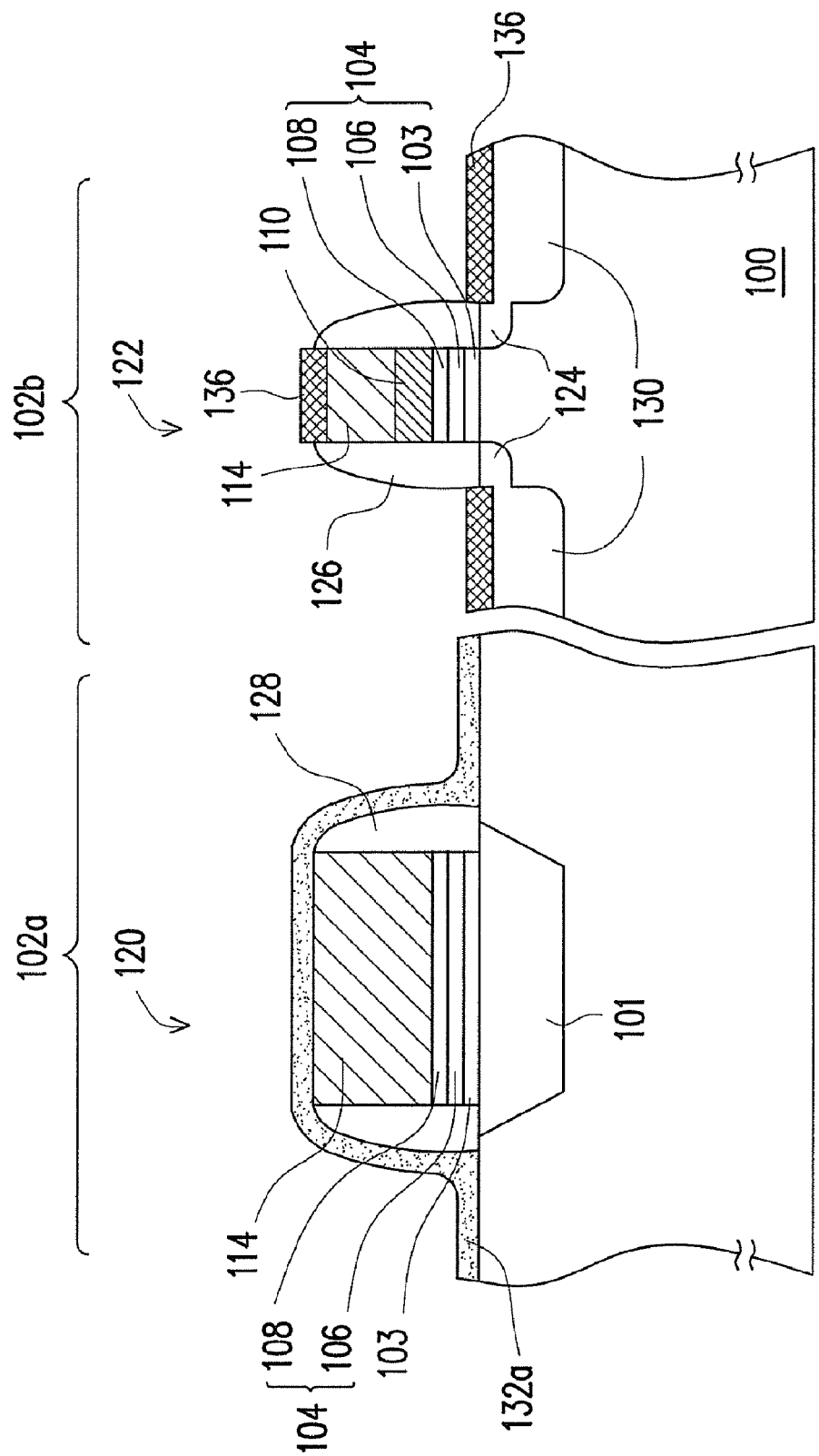

Referring to FIG. 1F, the SAB material layer 132 in the second area 102b is removed, using the patterned photoresist layer 134 as a mask, so as to form a SAB layer 132a. The SAB layer 132a exposes the polysilicon layer 114 and the substrate 100 in the second area 102b. It is noted that the mask 133 used for defining the patterned photoresist layer 134 and then forming the SAB layer 132a is the same as the mask used for removing the metal layer 110 in the first area 102a (see FIG. 1B). That is, the same mask can be used twice for different process steps, so as to reduce the fabrication cost. Thereafter, a metal layer (not shown) is formed over the substrate 100, and a thermal process is performed so that a portion of the metal layer reacts with silicon under the metal layer to form a metal salicide layer 136 on the surface of the polysilicon layer 114 and the surface of the substrate 100 in the second area 102b. The unreacted metal layer is then removed.

In summary, according to the method of the present invention, the resistance of the metal gate structure 122 is reduced by forming the metal layer 110 serving as a work function metal layer and the metal salicide layer 136 in the MOS area (i.e. second area 102b); thus, the performance of the device is enhanced. On the other hand, the performance of the resistor 120 is enhanced by removing the metal layer 110 in the resistor area (i.e. first area 102a). In details, the metal layer 110 in the resistor area is removed to avoid current flowing through the metal layer 110 so as to degrade the performance of the resistor 120. The current flows through the polysilicon layer 114 instead, so that the performance of the resistor 120 is enhanced. Further, the method of removing the metal layer 110 in the resistor area is simple and quick and can be completed in a short process loop (see FIG. 1B). The mask used for removing the metal layer 110 in the resistor area (see FIG. 1B) is the same as the mask used for forming the SAB layer 132 in the resistor area (see FIG. 1E). In other words, no extra mask is needed, so that the fabrication cost is reduced and the competitive advantage is achieved.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of forming a semiconductor structure, comprising:
   providing a substrate, wherein the substrate has a first area and a second area;
   sequentially forming a dielectric layer and a metal layer over the substrate in the first area and the second area;
   removing the metal layer in the first area by using a salicide block mask;
   forming a polysilicon layer over the substrate in the first area and the second area;
   patterning the polysilicon layer and the dielectric layer to form a resistor in the first area and patterning the polysilicon layer, the metal layer and the dielectric layer to form a metal gate structure in the second area; and
   forming a salicide block layer over the substrate and then removing a portion of the salicide block layer from the second area to expose the polysilicon layer and the substrate in the second area.

2. The method of claim 1, further comprising forming a shallow trench isolation structure in the substrate in the first area.

3. The method of claim 1, wherein during the step of removing the metal layer in the first area comprises:
   forming a patterned photoresist layer over the substrate to expose the metal layer in the first area, wherein a mask used for forming the patterned photoresist layer is the salicide block mask used for forming the salicide block layer; and
   removing the metal layer in the first area by using the patterned photoresist layer as a mask.

4. The method of claim 1, wherein the patterned photoresist layer comprises a negative photoresist material.

5. The method of claim 1, wherein the dielectric layer is a stacked structure comprising a high-k layer and a cap layer sequentially formed on the substrate.

6. The method of claim 5, wherein the high-k layer comprises $HfO_2$, $ZrO_2$, $Al_2O_3$, AlN, $TiO_2$, $La_2O_3$, $Y_2O_3$, $Gd_2O_3$, $Ta_2O_5$ or a combination thereof.

7. The method of claim 5, wherein the cap layer comprises $Al_2O_3$, $Ga_2O_3$, $In_2O_3$ or $Ti_2O_3$ when the second area is for forming a PMOS transistor, or comprises $La_2O_3$, $Dy_2O_3$, $Y_2O_3$, $MgO_2$ or an oxide of a lanthanide series element when the second area is for forming a NMOS transistor.

8. The method of claim 1, wherein the metal layer comprises TiN, TaC, TaCNO, TaCN or TaN.

9. A semiconductor structure, comprising:
   a substrate, having a first area and a second area;
   a resistor, disposed in the first area, wherein the resistor does not comprise any metal layer, wherein a shallow trench isolation structure is disposed in the substrate in the first area below the resistor, and wherein a salicide block layer is disposed in the first area covering the resistor; and
   a metal gate structure, disposed in the second area,
   wherein the resistor and the metal gate structure are in substantially the same plane,
   wherein the resistor comprises a dielectric layer and a polysilicon layer sequentially disposed on the substrate,
   wherein the dielectric layer is a stacked structure comprising a high-k layer and a cap layer sequentially disposed on the substrate, and
   wherein the high-k layer comprises $HfO_2$, $ZrO_2$, $Al_2O_3$, AlN, TiO2, $La_2O_3$, $Y_2O_3$, $Gd_2O_3$, $Ta_2O_5$ or a combination thereof; and wherein the cap layer comprises $Al_2O_3$, $Ga_2O_3$, $In_2O_3$ or $Ti_2O_3$ when the second area is for forming a PMOS transistor, or comprises $La_2O_3$, $Dy_2O_3$, $Y_2O_3$, $MgO_2$ or an oxide of a lanthanide series element when the second area is for forming a NMOS transistor.

10. The semiconductor structure of claim 9, wherein the metal gate structure comprises a dielectric layer, a metal layer and a polysilicon layer sequentially disposed on the substrate.

11. The semiconductor structure of claim 10, wherein the metal layer comprises TiN, TaC, TaCNO, TaCN or TaN.

12. A semiconductor structure, comprising:
   a substrate, having a first area and a second area;
   a resistor, disposed in the first area and comprising a first insulation layer, a first high-k layer, a first cap layer and a first polysilicon layer sequentially disposed on the substrate in the first area, wherein the resistor does not comprise any metal layer, and wherein a shallow trench isolation structure is disposed in the substrate in the first area below the resistor; and
   a metal gate structure, disposed in the second area and comprising a second insulation layer, a second high-k layer, a second cap layer, a metal layer, a second polysilicon layer and a metal salicide layer sequentially disposed on the substrate in the second area.

* * * * *